(12) United States Patent
Aboulhouda et al.

(10) Patent No.: US 10,180,542 B2
(45) Date of Patent: Jan. 15, 2019

(54) CONTROL DEVICE AND METHOD FOR CONTROLLING BIASING OF MULTIPLE LIGHT SOURCES OF MULTIPLE CHANNELS OF A MULTI-CHANNEL OPTICAL COMMUNICATIONS MODULE

(71) Applicant: Avago Technologies International Sales Pte. Limited, Singapore (SG)

(72) Inventors: Samir Aboulhouda, Cupertino, CA (US); Faouzi Chaahoub, San Jose, CA (US); Ahmed Rashid Syed, San Jose, CA (US); Kartikeya Gupta, San Jose, CA (US); Kazi Asaduzzaman, Union City, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/638,988

(22) Filed: Jun. 30, 2017

(65) Prior Publication Data
US 2018/0267257 A1  Sep. 20, 2018

Related U.S. Application Data

(60) Provisional application No. 62/473,448, filed on Mar. 19, 2017.

(51) Int. Cl.
*H04B 10/00* (2013.01)
*G02B 6/38* (2006.01)
(Continued)

(52) U.S. Cl.
CPC ........... *G02B 6/3885* (2013.01); *G02B 6/421* (2013.01); *G02B 6/428* (2013.01); *G02B 6/4249* (2013.01);
(Continued)

(58) Field of Classification Search
CPC .... H04B 10/40; H04B 10/505; H04B 10/506; H04B 10/516; H04B 10/5561;
(Continued)

(56) References Cited

U.S. PATENT DOCUMENTS 8,606,111 B2 * 12/2013 Hu .......................... H01S 5/042
                                                   398/136
8,837,934 B2 *  9/2014 Shih ....................... H04B 10/40
                                                   398/135

(Continued)

FOREIGN PATENT DOCUMENTS

| CN | 102723664 A | 10/2012 |
| JP | 2014215600 A | 11/2014 |
| WO | 2016068070 A1 | 5/2016 |

OTHER PUBLICATIONS

English language machine translation of WO2016068070A1, published May 6, 2016, 11 pages.
(Continued)

*Primary Examiner* — Hanh Phan
(74) *Attorney, Agent, or Firm* — Sheridan Ross P.C.

(57) ABSTRACT

A control device that may be implemented in a single IC chip is provided that is capable of controlling EAM bias voltages and DFB bias currents and of monitoring the EAM photocurrents and received signal strength indicators (RSSIs) in a multi-channel optical transceiver module. The control device IC chip can be manufactured at relatively low cost with relatively high yield, and can be implemented in a relatively small area. To implement the control device in a single IC chip, multiple supply voltage domains are used in the IC chip, one of which is a negative supply voltage domain and one of which is a positive supply voltage domain. In order to provide these different supply voltage domains, a level shift circuit is employed in the IC chip that converts signals from the positive to the negative supply (Continued)

voltage domain, and vice versa, and changes the voltage levels, as needed.

30 Claims, 5 Drawing Sheets

(51) Int. Cl.
*G02B 6/42* (2006.01)
*H01S 5/068* (2006.01)
*H04B 10/50* (2013.01)
*H04B 10/516* (2013.01)

(52) U.S. Cl.
CPC ............ *H01S 5/068* (2013.01); *H04B 10/504* (2013.01); *H04B 10/516* (2013.01)

(58) Field of Classification Search
CPC .......... H04B 10/50595; H04B 10/5057; H04B 10/572; H01S 5/026; H01S 5/0265
USPC ....... 398/135, 136, 137, 138, 139, 183, 188, 398/192, 193, 194, 195, 196, 197, 198, 398/158, 159, 33, 38; 372/32, 34, 36, 372/38.02, 50.1
See application file for complete search history.

(56) References Cited

U.S. PATENT DOCUMENTS

| | | | |
|---|---|---|---|
| 8,929,748 B2* | 1/2015 | Hu ...................... | H04B 10/506 398/135 |
| 2004/0218931 A1* | 11/2004 | Frederiksen, Jr. .... | G02F 1/0123 398/198 |
| 2011/0267670 A1* | 11/2011 | Schemmann ......... | G02F 1/0123 359/239 |

OTHER PUBLICATIONS

English language machine translation of CN102723664A, published Oct. 10, 2012, 5 pages.
English language machine translation of JP2014215600A, published Nov. 17, 2014, 8 pages.

\* cited by examiner

CONTROL DEVICE AND METHOD FOR CONTROLLING BIASING OF MULTIPLE LIGHT SOURCES OF MULTIPLE CHANNELS OF A MULTI-CHANNEL OPTICAL COMMUNICATIONS MODULE

CROSS-REFERENCE TO RELATED APPLICATIONS

The present application is a nonprovisional application that claims priority to the filing date of a U.S. provisional application having Ser. No. 62/473,448, filed on Mar. 19, 2017, entitled "A CONTROL DEVICE AND METHOD FOR CONTROLLING BIASING OF MULTIPLE LIGHT SOURCES OF MULTIPLE CHANNELS OF A MULTI-CHANNEL OPTICAL COMMUNICATIONS MODULE," which is incorporated herein by reference in its entirety.

FIELD OF THE INVENTION

The invention relates to multi-channel optical communications modules. More particularly, the invention relates to a single control device that is capable of controlling biasing of multiple light sources of multiple respective channels of a multi-channel optical communications module.

BACKGROUND OF THE INVENTION

A variety of multi-channel optical communications modules exist for simultaneously transmitting and/or receiving multiple optical data signals over multiple respective optical channels. A Multi-channel optical transmitter module, as that term is used herein, denotes an optical communications module having multiple optical transmit channels for simultaneously transmitting multiple optical signals over one or more optical waveguides (e.g., optical fibers). A Multi-channel optical receiver module, as that term is used herein, denotes an optical communications module having multiple optical receive channels for simultaneously receiving multiple respective optical signals over one or more optical waveguides. A Multi-channel optical transceiver module, as that term is used herein, denotes an optical communications module having multiple optical transmit channels and multiple optical receive channels for simultaneously transmitting and receiving multiple optical signals over one or more optical waveguides.

For each of these different types of parallel optical communications modules, a variety of designs and configurations exist. A typical electrical subassembly (ESA) layout for a multi-channel optical transceiver module includes a circuit board, such as a printed circuit board (PCB), and various electrical components mounted on the circuit board, such as one or more controller chips, a laser driver chip, a transimpedance amplifier (TIA) chip, and a receiver chip. A typical optical subassembly (OSA) for a multi-channel transceiver module includes multiple optoelectronic components (i.e., laser diodes and photodiodes), which are mounted on the circuit board and electrically coupled to the ESA via bond wires and/or via electrical traces of the PCB. An optical coupling system of the module couples optical signals generated by the laser diodes into ends of one or more optical waveguides (e.g., optical fibers) and couples optical signals passing out of ends of one or more optical fibers onto the photodiodes.

The newest generation of high-speed multi-channel optical transceiver modules for long reach applications use externally-modulated lasers (EMLs) as the light sources rather than directly-modulated (DM) lasers. While different types of EMLs exist, the type of EMLs that are typically used for long reach applications comprise an electro-absorption modulator (EAM) integrated with a distributed feedback (DFB) laser in the same integrated circuit to form an integrated EAM-DFB laser. In general, EAM-DFB lasers are preferred over DM lasers for long reach applications because EAM-DFB lasers have lower chirp and can be operated at higher bandwidths than DM lasers.

However, use of an EAM-DFB lasers in a multi-channel optical transceiver module requires a complex scheme for controlling the EAM bias voltage and the DFB bias current and for monitoring the EAM photocurrent. An ESA implementation for carrying out such a complex scheme in, for example, a four-channel optical transceiver module, sometimes referred to as a Quad-channel optical transceiver module, would require multiple controller IC chips and other electronic components that would be expensive to design and manufacture. Such a complex scheme would also consume a large amount of area on the PCB of the ESA, have low manufacturing yield and would be difficult to thermally manage.

Accordingly, a need exists for a control device that is capable of controlling the EAM bias voltage and DFB bias current, that is capable of monitoring the EAM photocurrent, that can be manufactured at relatively low cost with relatively high yield, and that can be implemented in a relatively small area.

WRITTEN DESCRIPTION

Figure 1:
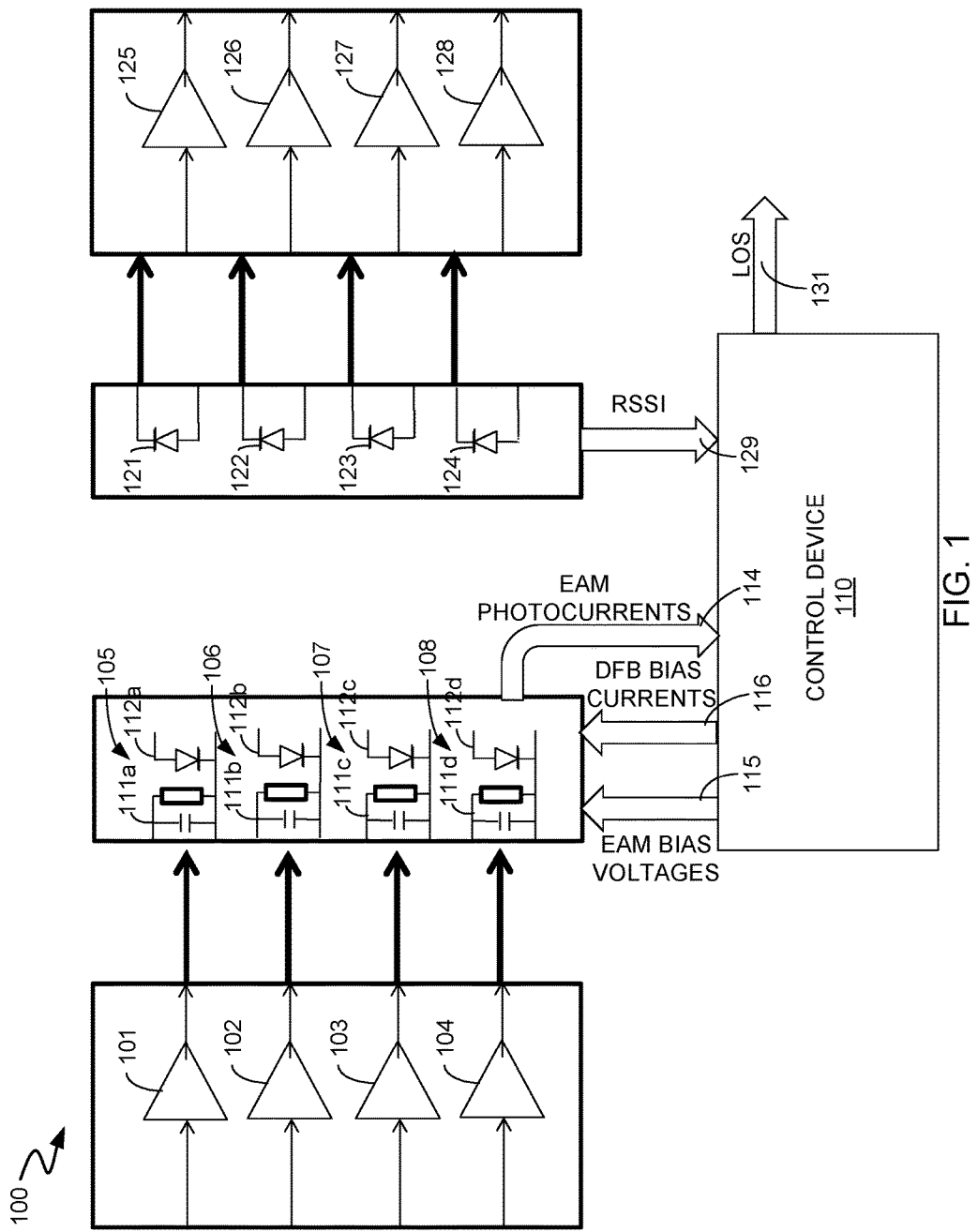
FIG. 1 illustrates a system-level block diagram of a multi-channel optical transceiver module in accordance with a representative embodiment.

In accordance with the representative, or exemplary, embodiments described herein, a control device is provided that may be implemented in a single controller IC chip and that is capable of controlling EAM bias voltages, controlling DFB bias currents and monitoring the EAM photocurrents in a multi-channel optical transceiver module having an optical transmitter and an optical receiver. The controller IC chip can be manufactured at relatively low cost with relatively high yield, and can be implemented in a relatively small area. In order to implement the control device in a single controller IC chip, multiple supply voltage domains are used in the controller IC chip, one of which is a negative supply voltage domain and one of which is a positive supply voltage domain. In order to provide these different supply voltage domains in the single controller IC chip, a level shift circuit is provided in the controller IC chip that converts signals from the positive supply voltage domain to the negative supply voltage domain, and vice versa, as needed. The level shift circuit also changes the voltage amplitudes, as needed.

In the following detailed description, for purposes of explanation and not limitation, exemplary, or representative, embodiments disclosing specific details are set forth in order to provide a thorough understanding of the inventive principles and concepts. However, it will be apparent to one of ordinary skill in the art having the benefit of the present disclosure that other embodiments according to the present teachings that are not explicitly described or shown herein are within the scope of the appended claims. Moreover, descriptions of well-known apparatuses and methods may be omitted so as not to obscure the description of the exemplary embodiments. Such methods and apparatuses are clearly within the scope of the present teachings, as will be understood by those of skill in the art.

It should also be understood that the word "example," as used herein, is intended to be non-exclusionary and non-limiting in nature. More particularly, the word "exemplary," as used herein, indicates one among several examples, and it should be understood that no undue emphasis or preference is being directed to the particular example being described. It should also be understood that the word "exemplary," as used herein, is intended to be non-exclusionary and non-limiting in nature.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a," "an" and "the" include both singular and plural referents, unless the context clearly dictates otherwise. Thus, for example, "a device" includes one device and plural devices. The term "substantially" means to within limits or degrees acceptable to those of skill in the art. For example, the term "substantially parallel to" means that a structure or device may not be made perfectly parallel to some other structure or device due to tolerances or imperfections in the process by which the structures or devices are made. The term "approximately" means to within an acceptable limit or amount to one of ordinary skill in the art. Where a first device is said to be directly connected or directly coupled to a second device, this encompasses examples where the two devices are connected together without any intervening devices other than electrical connectors (e.g., wires). Where a first device is said to be electrically coupled to a second device, this encompasses examples where the two devices are directly connected together without any intervening devices other than electrical connectors (e.g., wires) and examples where the first and second devices are electrically connected to one another via one or more intervening devices (e.g., one or more resistors).

Exemplary embodiments will now be described with reference to the figures, in which like reference numerals represent like components, elements or features. It should be noted that features, elements or components in the figures are not intended to be drawn to scale, emphasis being placed instead on demonstrating inventive principles and concepts.

FIG. 1 illustrates a system-level block diagram of a multi-channel optical transceiver module 100 in accordance with a representative embodiment that incorporates the control device 110. In accordance with this representative embodiment, the multi-channel optical transceiver module 100 is a Quad-channel optical transceiver module having four channels. It should be noted, however, that the inventive principles and concepts are not limited with respect to the number of channels that are in the multi-channel optical transceiver module 100. The multi-channel optical transceiver module 100 has N channels, where N is a positive integer that is greater than or equal to 2, and preferably is greater than or equal to 4.

In accordance with this representative embodiment, the multi-channel optical transceiver module 100 has four laser drivers 101-104, respectively, that generate respective time-varying electrical signals that are used to modulate four externally-modulated lasers (EMLs) 105-108, respectively. In accordance with this representative embodiment, each of the EMLs 105-108 comprises an EAM 111$a$-111$d$ and a DFB laser 112$a$-112$d$, respectively. Typically, each of the EMLs 105-108 comprises an EAM 111$a$-111$d$ and a DFB 112$a$-112$d$, respectively, that are integrated together in an IC chip. Each of the EMLs 105-108 may be in a respective IC chip or all of the EMLs 105-108 may be contained in a single IC chip or in two or more IC chips.

The manner in which EMLs operate is well known and therefore is not described herein in the interest of brevity. In general, each of the DFBs 112$a$-112$d$ receives a DFB bias current and generates a direct current (DC) optical signal, which is sensed by the respective EAMs 111$a$-111$d$. Each of the EAMs 111$a$-111$d$ produces an optical signal that is related to the optical signal sensed by the respective EAM 111$a$-111$d$. Each of the EAMs 111$a$-111$d$ receives a radio frequency (RF) signal and has a respective modulator circuit that is modulated based on the respective RF signal. Modulation of the modulation circuit results in modulation of the respective EAM photocurrent, which causes the optical signal produced by the respective EAM 111$a$-111$d$ to modulate. A variety of modulation schemes may be used to modulate the EAMs 111$a$-111$d$, including, but not limited to, the known Non-Return-To-Zero (NRZ) and Pulse Amplitude Modulation (PAM)-4 modulation schemes.

The EMLs 105-108 generate optical data signals that are coupled by an optical coupling system (not shown) of the module 100 into the end of one or more optical waveguides (not shown), which are typically single mode optical fibers (SMLs) in long reach applications. The inventive principles and concepts are not limited with respect to the type of waveguide that is used for this purpose or with respect to the length of the optical link in which the module 100 is used.

The control device 110 monitors the EAM photocurrents of all of the EAMs 111$a$-111$d$, as indicated by arrow 114. The control device 110 controls the EAM bias voltages of all of the EAMs 111$a$-111$d$, as indicated by arrow 115. The control device 110 controls the DFB bias currents of all of the DFBs 112$a$-112$d$, as indicated by arrow 116. As indicated above, the control device 110 preferably is implemented as a single controller IC chip, thereby allowing the control device 110 to consume very little space and to be manufactured at relatively low cost and with relatively high manufacturing yield compared to if multiple controller IC chips were used. The manner in which this is achieved is described below in more detail with reference to FIGS. 2-5.

The multi-channel optical transceiver module 100 includes four photodetectors 121-124, i.e., N is equal to 4 in accordance with this representative embodiment. The photodetectors 121-124 may be, for example, PIN diodes. Each photodetector 121-124 detects an optical signal and converts the optical signal into an electrical current signal. Receiver circuits 125-128 receive the electrical signals output by the photodetectors 121-124, respectively, and perform conditioning and processing of the electrical current signals to recover the data that was carried in the respective optical signals detected by the photodetectors 121-124, respectively. Each of the receiver circuits 125-128 typically includes a TIA circuit that converts the current signal into a voltage signal, gain circuitry that amplifies the voltage signal and clock and data recovery (CDR) circuitry that recovers the data from the amplified voltage signal.

The photodetectors 121-124 are electrically coupled with respective receiver signal strength indicator (RSSI) circuits (not shown) of the receiver circuits 125-128 that detect the strengths of the respective optical signals produced by the respective photodetectors 121-124 and output respective RSSI signals indicative of the strengths of the respective optical signals. Typically, the gain of the respective TIA circuit of the respective receiver circuit 125-128 is adjusted based on the RSSI signal. RSSI circuits, the manner in which they operate and the manner in which RSSI signals are used to adjust the gain of a TIA circuit are well known, and therefore will not be described herein in detail in the interest of brevity.

In accordance with a representative embodiment, the control device 110 receives the RSSI signals, as indicated by arrows 129 and monitors the RSSI signals. In some cases, the RSSI signal may be so low that it indicates a loss of signal (LOS). In accordance with this representative embodiment, the control device 110 monitors the RSSI signals and generates an LOS signal, as indicated by arrow 131, if an RSSI signal indicates that no signal is being detected by the respective photodetector 121-124.

The laser drivers 101-104, the control device 110 and the receiver circuits 125-128 comprise the ESA of the multi-channel optical transceiver module 100. The ESA typically also includes a PCB (not shown) on which the components of the ESA are mounted. The laser drivers 101-104 are typically implemented in a laser driver IC chip. The EMLs 105-108 and the photodetectors 121 comprise the OSA of the multi-channel optical transceiver module 100 and are typically implemented in one or more OSA IC chips. The OSA IC chip(s) may be mounted on the PCB of the ESA or on one or more other mounting surfaces (e.g., a land grid array (LGA) or a ball grid array (BGA)) that are mechanically coupled with the PCB of the ESA. For example, the OSA IC chip(s) may be mounted on respective BGAs that mate with BGA sockets disposed on the ESA PCB. Electrical interconnections between the OSA IC chip(s) and the ESA are made through the BGA/BGA socket interconnection, through bond wires (not shown) and/or through traces (not shown) of the PCB of the ESA. For ease of illustration, these mounting arrangements and electrical interconnections are not shown in FIG. 1.

Figure 2:
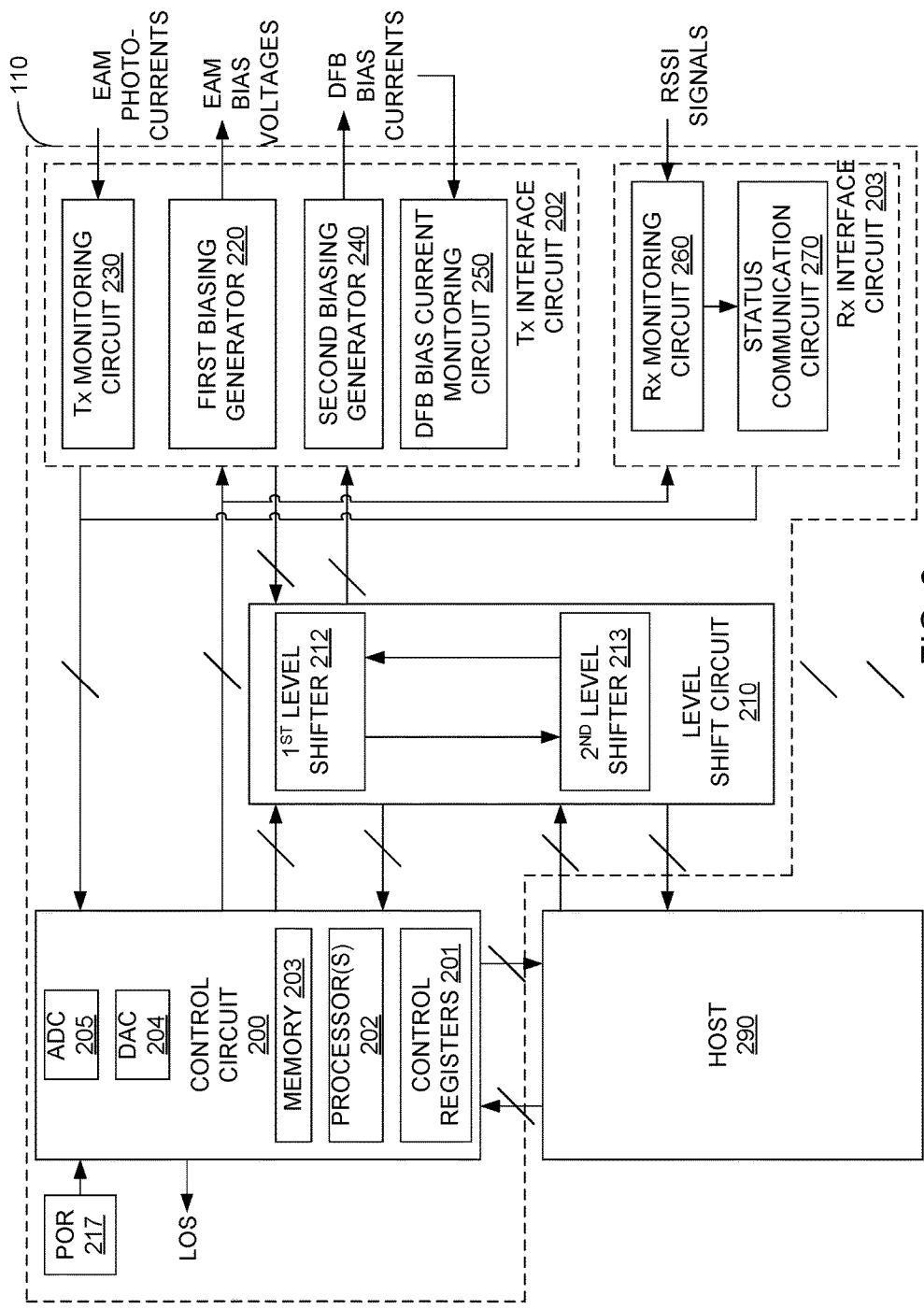
FIG. 2 illustrates a block diagram of the control device shown in FIG. 1 in accordance with a representative embodiment.

FIG. 2 illustrates a block diagram of the control device 110 shown in FIG. 1 in accordance with a representative embodiment in which the control device 110 includes a control circuit 200, a level shift circuit 210, a transmitter (Tx) interface circuit 202, an receiver (Rx) interface circuit 203, and power-on-reset (POR) logic 217. The control circuit 200 includes control registers 201, one or more processors 202, memory 203, a digital-to-analog converter (DAC) 204, and an analog-to-digital converter (ADC) 205. POR logic 217 of the control device 110 resets the control registers 201 of the control circuit 200 to initial values when the control device 110 is powered on. For clarity, a variety of components that are typically included in the control device 110, such as, for example, built-in-self-test (BIST) circuitry, bias disable (BDIS) circuitry and clock tuning circuitry are not shown in FIG. 2, as they are outside of the scope of the inventive principles and concepts being described herein.

The control circuit 200 controls the operations of the control device 110 and the level shift circuit 210 shifts signals between multiple supply voltage domains. As indicated above, in order to implement the control device 110 in a single controller IC chip, multiple supply voltage domains are used in the controller IC chip, one of which is a negative supply voltage domain that ranges from −1.5V to −3.3V and one of which is a positive supply voltage domain that ranges from 0V to +1.8V. The negative supply voltage domain is needed in order to supply negative bias voltages to the EAMs 111a-111d shown in FIG. 1, but in accordance with this embodiment, at least a portion of the control circuit 200, including the control registers 201, also operates in the negative supply voltage domain. The positive supply voltage domain is needed in order to supply positive bias currents to the DFBs 112a-112d. The level shift circuit 210 is provided in the control device 110 for converting electrical signals from the positive supply voltage domain to the negative supply voltage domain, and vice versa, as needed. The level shift circuit 210 is described below in more detail with reference to FIGS. 4 and 5.

The Tx interface circuit 202 includes a Tx monitoring circuit 230 that monitors the EAM photocurrents produced by the EAMs 111a-111d (FIG. 1), a first biasing generator 220 that generates the EAM bias voltages for the EAMs 111a-111d, a second biasing generator 240 that generates DFB bias currents for the DFBs 112a-112d, and a DFB laser bias current monitoring circuit 250 that monitors the DFB bias currents. The Rx interface circuit 203 includes an Rx monitoring circuit 260 that monitors the RSSI signals generated by the respective RSSI circuits (not shown) of the respective receiver circuits 125-128 (FIG. 1) and a status communication circuit 270 for outputting an LOS signal in response to a determination by the Rx monitoring circuit 260 that a respective RSSI signal indicates that no signal is being detected by a respective one of the photodetectors 121-124 (FIG. 1). The control circuit 200 outputs an LOS signal if the status monitoring circuit 270 sends an indication to the control circuit 200 that no signal is being detected by one of the RSSI circuits.

The control circuit 200 is in two-way communication with a host 290, with the level shift circuit 210, with the Tx interface circuit 202 and with the Rx interface circuit 203. The host 290 is in two-way communication with the control circuit 200 and with the level shift circuit 210. The level shift circuit 210 is in two-way communication with the Tx interface circuit 202. In accordance with this representative embodiment, the level shift circuit 210 has a first level shifter 212 that is configured to convert an input of the first level shifter 212 that is in the second (positive) supply voltage domain to an output of the first level shifter 212 that is in the first (negative) supply voltage domain. For example, in accordance with this representative embodiment, the conversion is from an input signal having a voltage in the range of 0V to +1.8V into an output signal having a voltage in the range of −1.5V to −3.3V (down conversion). In accordance with this representative embodiment, the level shift circuit 210 has a second level shifter 213 that is configured to convert an input signal of the second level shifter 213 that is in the first (negative) supply voltage domain to an output of the second level shifter 213 that is in the second (positive) supply voltage domain. For example, in accordance with this representative embodiment, the conversion is from an input signal having a voltage in the range of −1.5V to −3.3V into an output signal having a voltage in the range of 0V to +1.8V (up conversion). A representative embodiment of the manner in which these conversions are performed is described below with reference to FIGS. 2 and 3.

The control registers 201 are used to store the EAM bias voltage values and to store the DFB bias current values. The control registers 201 are programmed by the host 290 to set the EAM bias voltage values for the EAMs 111a-111d and to set the DFB bias current values for the DFBs 112a-112d. A user pre-programmed algorithm performed by the host 290 generates digital codes corresponding to new EAM bias voltage values and new DFB bias current values that will achieve a desired extinction-ratio (ER) for the optical-eye that is achieved (as observed and computed through an optical oscilloscope). The host 290 sends the corresponding digital codes to the control circuit 200, which stores them in the control registers 201.

Figure 3:
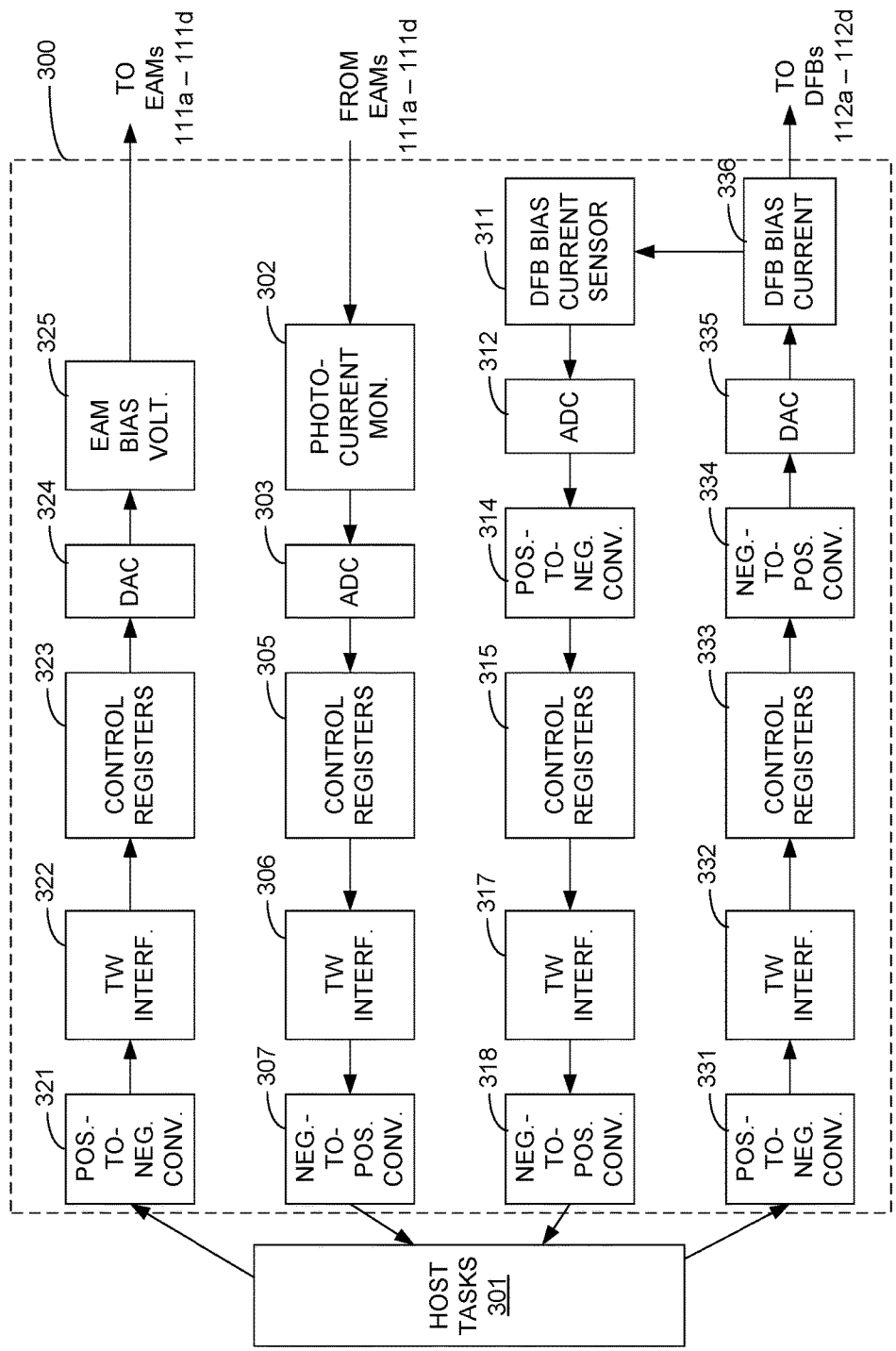
FIG. 3 illustrates a block diagram that demonstrates the operations performed by the control device shown in FIGS. 1 and 2 in accordance with a representative embodiment.

FIG. 3 illustrates a flow diagram that demonstrates the operations performed by the control device 110 shown in FIGS. 1 and 2 in accordance with a representative embodiment. In FIG. 3, the dashed block labeled with reference numeral 300 represents operations performed in the control device 110. The block labeled with reference numeral 301 represents operations performed by the host 290. In accordance with this representative embodiment, because the EAM photocurrent can vary due to, for example, changes in temperature or the quality of the RF-modulation input of the EAMs 111a-111d, the host 290 continuously monitors the photocurrents of the EAMs 111a-111d and the bias currents of the DFBs 112a-112d in a "closed-loop" fashion to maintain a desired optical ER.

Block 302 represents the tasks performed by the Tx monitoring circuit 230 in monitoring the photocurrents of the EAMs 111a-111d. The monitored photocurrents are analog values that are converted by the ADC 205 into respective digital values, as indicated by block 303. The respective digital values are then used to lookup the corresponding digital codes stored in the control registers 201, as indicated by block 305. The digital codes are communicated over the aforementioned two-wire interface, as indicated by block 306, to the level shift circuit 210. Because the EAMs 111a-111d and the control registers 201 operate in the negative supply voltage domain (i.e., the first supply voltage domain) and the host 290 operates in the positive supply voltage domain (i.e., the second supply voltage domain), the digital codes communicated over the two-wire interface at block 306 are converted by the second level shifter 213 to the positive supply voltage domain at voltage levels that can be used by the host 290. Block 307 represents the tasks performed by the level shifter 213 to convert the digital codes from the negative supply voltage domain to the positive supply voltage domain before the level shift circuit 210 sends the digital codes to the host 290.

Block 311 represents the tasks performed by the DFB laser bias current monitoring circuit 250 of the Tx interface circuit 202 in monitoring the bias currents of the DFBs 112a-112d. The monitored DFB bias currents are analog values that are converted into respective digital values by the ADC 205, as indicated by block 312. Because the DFBs 112a-112d are in the positive supply voltage domain and the control registers 201 are in the negative supply voltage domain, the digital values output from the ADC 205 at block 312 are converted to the negative supply voltage domain by the first level shifter 212 before being used at block 315 to lookup the corresponding digital codes in the control registers 201. Block 314 represents the task performed by the first level shifter 212 to convert the digital values output from the ADC at block 312 from the positive supply voltage domain to the negative supply voltage domain. The converted digital values are then used to lookup the corresponding digital codes stored in the control registers 201, as indicated by block 315.

As indicated by block 317, the digital codes obtained from the control registers 201 are communicated over the two-wire interface to the second level shifter 213, which converts the digital codes to the positive supply voltage domain and forwards them to the host 290, as indicated by block 318. The digital codes are received in the host 290.

At block 301, the host 290 executes an algorithm that generates new EAM bias voltage values and new DFB bias current values based on the monitored EAM photocurrent values and the monitored DFB bias current values. Block 321 represents the tasks performed by the first level shifter 212 of converting the digital codes received from the host 290 corresponding to the new EAM bias voltage values from the positive supply voltage domain to the negative supply voltage domain. The digital codes are then transmitted over the two-wire interface to the control registers 201, as indicated by blocks 322 and 323, and are stored in the control registers 201. The digital codes are then inputted to the DAC 204, which converts them into corresponding EAM bias voltage values, as indicated by blocks 324. The EAM bias voltage values are then outputted from the control circuit 200 to the first biasing generator 220, which generates the corresponding EAM voltages and sends them to the respective EAMs 111a-111d.

Block 331 represents the tasks performed by the first level shifter 212 to convert the digital codes corresponding to the new DFB bias current values received from the host 290 from the positive supply voltage domain to the negative supply voltage domain. The digital codes are then transmitted over the two-wire interface to the control registers 201 and stored in the control registers, as indicated by blocks 332 and 333. Because the DFBs 112a-112d operate in the positive supply voltage domain, the digital codes are converted by the second level shifter 213 from the negative supply voltage domain to the positive supply voltage domain and then are inputted to the DAC 204, as represented by blocks 334 and 335. The DAC 204 converts the digital codes into corresponding DFB bias current values, as indicated by block 336, and outputs them to the second biasing generator 240, which uses them to generate the respective DFB bias currents for the respective DFBs 112a-112d.

Figure 4:
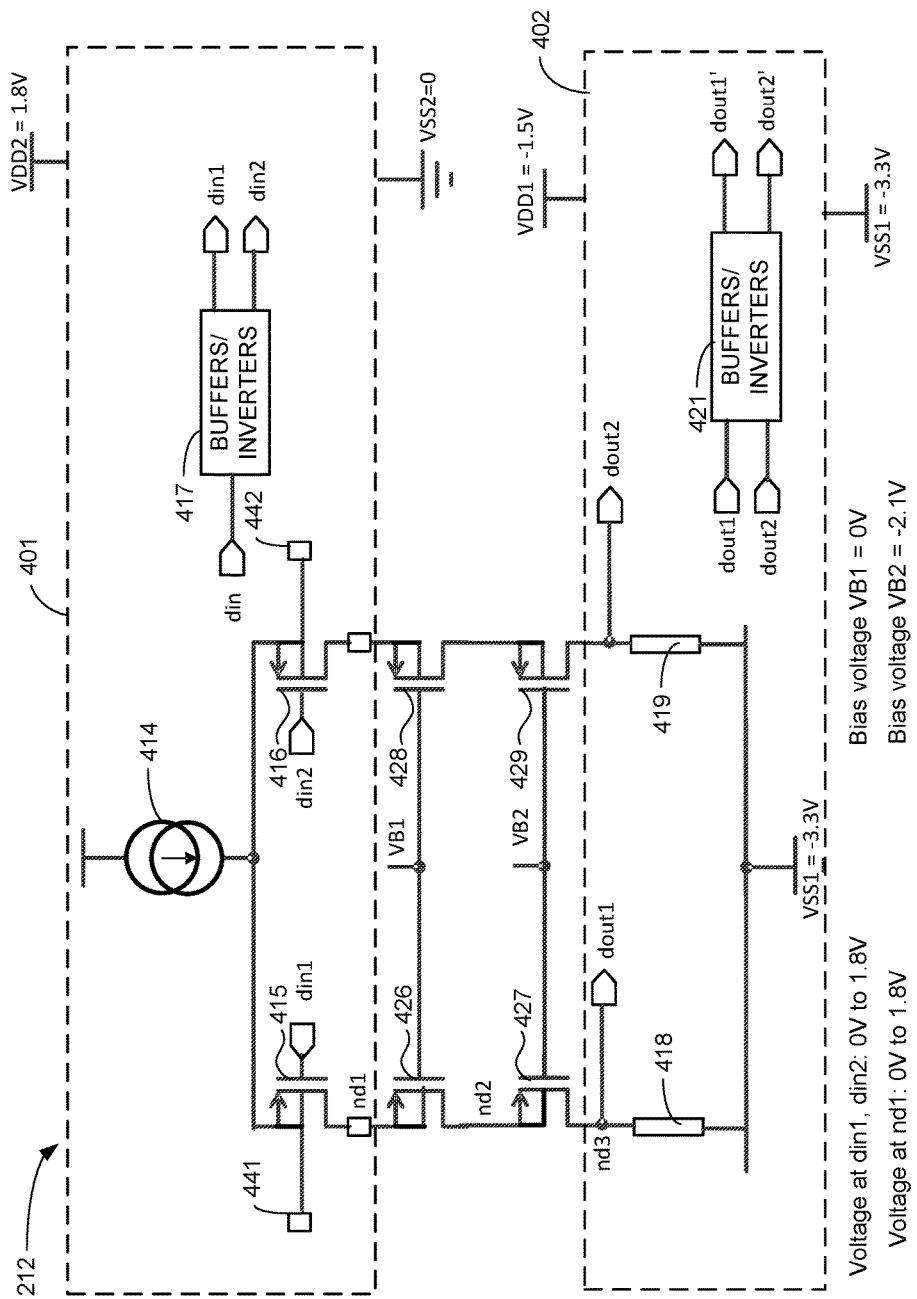
FIG. 4 illustrates a high-level schematic diagram of the first level shifter shown in FIG. 2 in accordance with a representative embodiment.

FIG. 4 illustrates a block diagram of the first level shifter 212 shown in FIG. 2 in accordance with a representative embodiment. The portion of the first level shifter 212 within dashed box 401 operates in the second supply voltage domain, which ranges from 0V to 1.8V in accordance with this representative embodiment. In accordance with this embodiment, to prevent electrical overstress from developing across their respective terminals, all devices enclosed in the dashed box 401 are placed inside of an isolated P-substrate and deep n-well" structure (not shown). The isolated P-substrate is biased at 0V and the "deep n-well is biased at +1.8V. The portion of the first level shifter 212 within dashed box 402 operates in the first supply voltage domain, which ranges from −3.3V to −1.5V in accordance with this representative embodiment.

The level shifting operations are performed by first, second and third PMOS transistors 415, 426 and 427, respectively, that are connected as shown. Fourth, fifth and sixth PMOS transistors 416, 428 and 429, respectively, form a dummy, or replica, stage used to convert a single-ended input signal, din, into a differential output signal, dout1', dout2'. The first and fourth PMOS transistors 415 and 416, respectively, form a differential pair.

The block labeled with reference numeral 417 represents circuitry that performs buffering and inversion operations on the single-ended input signal din ranging from 0V to +1.8V to convert it into a differential input signal, din1, din2, that toggles between 0V and +1.8V. The signals din1 and din2 are received at the gates of the first and fourth PMOS transistors 415 and 416, respectively. The sources of the PMOS transistors 415 and 416 are connected to a second terminal of a current source 414. A first terminal of the current source 414 is connected to the +1.8V supply voltage VDD2. In accordance with this representative embodiment, the current source 414 provides 400 micro-amperes (μA) of current. The drains of the PMOS transistors 415 and 416 are connected to the sources of PMOS transistors 426 and 428, respectively. The drains of the PMOS transistors 426 and 428 are connected to the sources of PMOS transistors 427 and 429, respectively. The gates of the PMOS transistors 426 and 428 receive a first bias voltage, VB1, of 0V. The gates of the PMOS transistors 427 and 429 receive a second bias voltage, VB2, of −2.1V. Devices 418 and 419 are passive devices, typically resistors, having first terminals that are connected to the drains of the PMOS transistors 427 and 429 and having second terminals that are connected to VSS1=−3.3V.

The differential input signal din1, din2 toggling between 0V and +1.8V causes a first terminal, nd1, where the drain of PMOS transistor 415 is connected to the source of PMOS transistor 426 to have a voltage on it that ranges from 0V to +1.8V. With the PMOS transistor 426 having a voltage on its source that ranges from 0V and +1.8V and a bias voltage on its gate of VB1=0V, the drain of PMOS transistor 426 has a voltage on it at a second terminal, nd2, that rages from −2.1V to about 0V. With the PMOS transistor 427 having a voltage on its source that ranges from −2.1V and about 0V and a bias voltage on its gate of VB2=−2.1V, the drain of PMOS transistor 427 has a voltage on it at a third terminal, nd3, that rages from about −2.1V to about −3.3V. The differential output signal dout1, dout2 is then input to buffer and inversion circuitry 421. The buffer and inversion circuitry 421 operates between −1.5V and −3.3V power supplies, with a toggle threshold of −2.4V, which means that the output signal, dout1, dout2 is "railed" to −3.3V for an input signal below or equal to −2.4V, and is "railed" to −1.5V for an input signal above −2.4V. In this way, the buffer and inversion circuitry 421 converts the differential output signal dout1, dout2 ranging from −2.1V to about −3.3V into the differential output signal dout1', dout2' that ranges from −1.5V to −3.3V. In other words, the voltage at terminal nd2 is shifted down relative to the voltage at terminal nd1, and the voltage at terminal nd3 is shifted down relative to the voltage at nd2 to produce a differential output signal, dout1, dout2, that swings between −2.1V and −3.3V, which is then further processed by the buffer and inversion circuitry 421 to achieve a different output signal, dout1', dout2' that swings between −1.5V and −3.3V.

In this manner, the first level shifter 212 performs a down conversion on the differential input signal din1, din2 to convert it from a signal that is in the second supply voltage domain ranging from 0V to +1.8V to a differential output signal dout1', dout2' that is in the first supply voltage domain ranging from −1.5V to −3.3V. Because the replica stage comprising MOS transistors 416, 428 and 429 operates in the same manner, it is not further described herein.

Terminal nd1 operates within the second voltage domain, i.e., between 0V and +1.8V. Terminal nd3 operates within the first voltage domain, i.e., between −1.5V and −3.3V. The PMOS transistors 415 416, 426, 427, 428 and 429 have their n-well terminals connected, to their respective source terminals. As shown in FIG. 4, the first MOS transistor 426 and the second MOS transistor 427 are vertically stacked (i.e., connected in a cascode arrangement).

Figure 5:
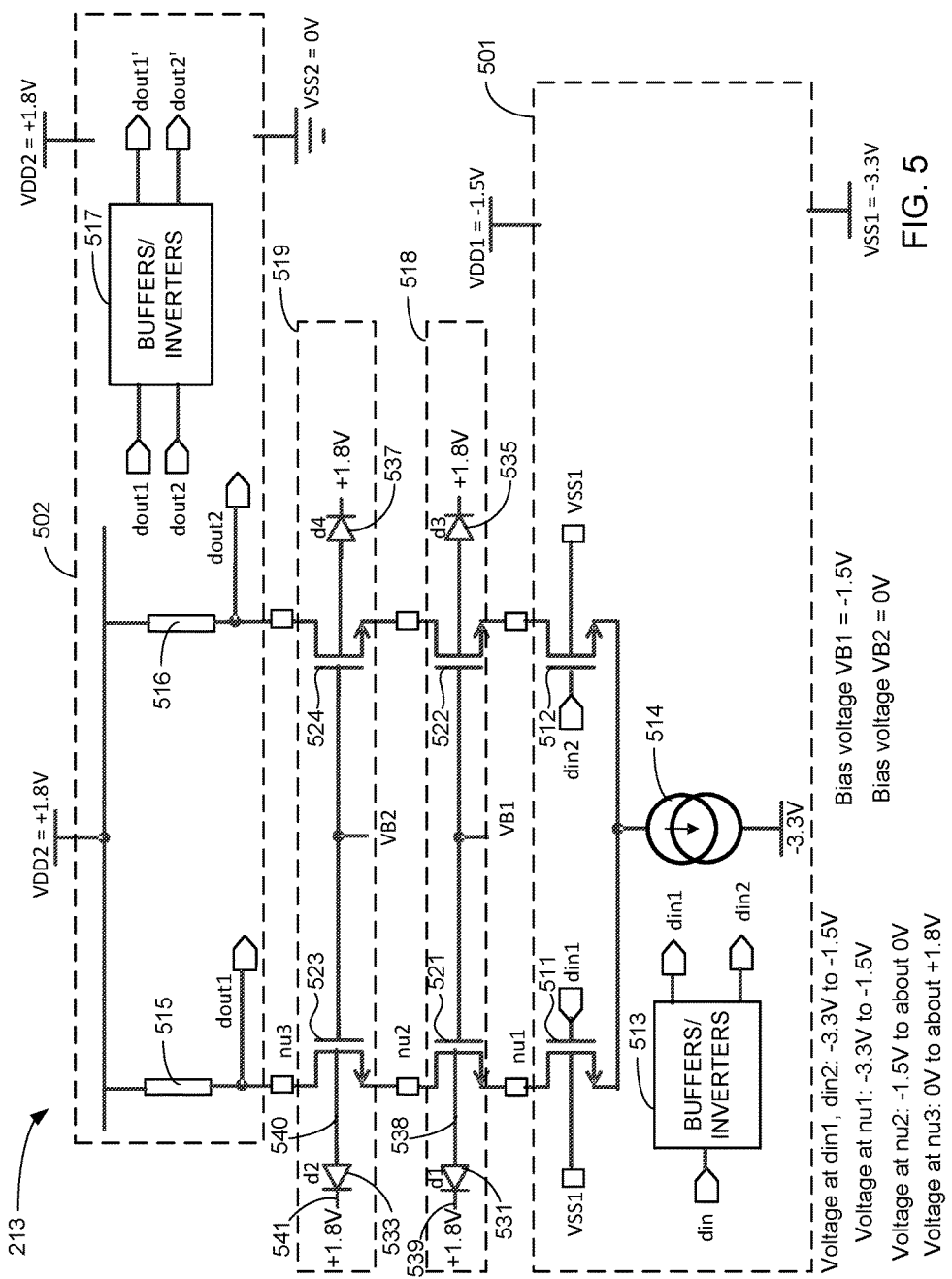
FIG. 5 illustrates a high-level schematic diagram of the first level shifter shown in FIG. 2 in accordance with a representative embodiment.

FIG. 5 illustrates a block diagram of the second level shifter 213 shown in FIG. 2 in accordance with a representative embodiment. The portion of the second level shifter 213 within dashed box 501 operates in the first supply voltage domain, which ranges from −3.3V to −1.5V in accordance with this representative embodiment. The portion of the second level shifter 213 within dashed box 502 operates in the second supply voltage domain, which ranges from 0V to 1.8V in accordance with this representative embodiment. In between the first and second supply voltage domains 501 and 502, respectively, are first and second voltage isolation devices 518 and 519, respectively, that isolate signals from the two supply voltage domains.

The level shifting operations are performed by first, second and third NMOS transistors 511, 521 and 523, respectively, that are connected as shown. Fourth, fifth and sixth NMOS transistors 512, 522 and 524, respectively, form a dummy, or replica, stage used to convert a single-ended input signal, din, into a differential output signal, dout1', dout2'. The first and fourth NMOS transistors 511 and 512 form a differential pair. The first and second voltage isolation devices 518 and 519, respectively, allow the two different supply voltages to be used while protecting the NMOS transistors 511, 521, 523, 512, 522, and 524 from catastrophic stress failure that could otherwise occur.

The block labeled with reference numeral 513 represents circuitry that performs buffering and inversion operations on a single-ended input signal din ranging from −3.3V to −1.5V to convert it into a differential input signal, din1, din2, that toggles between −3.3V and −1.5V. The signals din1 and din2 are received at the gates of the first and fourth NMOS transistors 511 and 512, respectively. The sources of the NMOS transistors 511 and 512 are connected to a second terminal of a current source 514. A first terminal of the current source is connected to the −3.3V supply voltage, VSS1. In accordance with this representative embodiment, the current source 514 provides 200 micro-amperes (μA) of current. The drains of the NMOS transistors 511 and 512 are connected to the sources of NMOS transistors 521 and 522, respectively. The drains of the NMOS transistors 521 and 522 are connected to the sources of NMOS transistors 523 and 524, respectively. The gates of the NMOS transistors 521 and 522 receive a first bias voltage, VB1, of −1.5V. The gates of the NMOS transistors 523 and 524 receive a second bias voltage, VB2, of 0V. Devices 515 and 516 are passive components, typically resistors.

The differential input signal din1, din2 toggling between −3.3V to −1.5V causes a first terminal, nu1, where the drain of NMOS transistor 511 is connected to the source of NMOS transistor 521 to have a voltage on it that ranges from −3.3V to −1.5V. With the NMOS transistor 521 having a voltage on its source that ranges from −3.3V and −1.5V and a bias voltage on its gate of VB1=−1.5V, the drain of NMOS transistor 521 has a voltage on it at a second terminal, nu2, that ranges from −1.5V to about 0V. With the NMOS transistor 523 having a voltage on its source that ranges from −1.5V and about 0V and a bias voltage on its gate of VB2=0V, the drain of NMOS transistor 523 has a voltage on it at a third terminal, nu3, that rages from about 0V to about +1.8V. In other words, the voltage at terminal nu2 is shifted up relative to the voltage at terminal nu1 and the voltage at terminal nu3 is shifted up relative to the voltage at nu2 to provide a differential output signal, dout1, dout2, that swings between 0V and +1.8V.

In this manner, the second level shifter 213 performs an up conversion on the differential input signal din1, din2 to convert it from a differential input signal that is in the first supply voltage domain ranging from −3.3V to −1.5V into a differential output signal, dout1, dout2, that is in the second supply voltage domain ranging from 0V to +1.8V. The block labeled with reference numeral 517 represents buffer and inversion circuitry for buffering and inverting the differential output signals, dout1 and dout2, to produce differential output signal, dout1', dout2', that is in the second supply voltage domain. Because the replica stage comprising NMOS transistors 512, 522 and 524 operates in the same manner, it is not further described herein.

Terminal nu1 operates within the first voltage domain, i.e., between −3.3V and −1.5V. Terminal nu3 operates within the second voltage domain, i.e., between 0V and +1.8V. In accordance with this representative embodiment, the first and second voltage isolation devices 518 and 519, respectively, each comprise a combination of a P-substrate isolation device (hereinafter "P-sub-iso device") and a deep n-well device. The combination is referred to hereinafter as a "P-sub-iso/deep n-well device." Each of the diode symbols d1 531, d2 533, d3 535 and d4 537 represents a P-sub-iso/deep n-well device. With respect to d1 531, the P-sub-iso device 538 is connected to the substrate terminal of NMOS 521 and the deep-n-well device 539 is at +1.8V. Likewise, with respect to d2 533, the P-sub-iso device 540 is connected to the substrate terminal of NMOS 523 and the deep-n-well device 541 is at +1.8V. The same is true for d3 535 and d4 537. In accordance with this embodiment, the substrate terminals of all of the NMOS transistors 521-524 utilize the same deep n-well device, but they all use separate P-sub-iso devices. The first voltage isolation device 518 has terminals that are coupled to terminals nu2 and nu1. The second voltage isolation device 519 has terminals that are coupled to terminal nu2 and nu3. The differential pair NMOS transistors 511 and 512 have substrate terminals are connected (through a highly-doped contact) to VSS1. As shown in FIG. 5, the first NMOS transistor 521 and the second NMOS transistor 523 are vertically stacked (i.e., connected in a cascode arrangement).

It should be noted that level shift circuits that have configurations that are different from the configurations shown and described herein may be used with the inventive principles and concepts, as will be understood by persons of skill in the art. Also, while the first and second supply voltage domains have been described herein as ranging from −3.3V to −1.5V and from 0V to 1.8V, respectively, the inventive principles and concepts are not limited to these supply voltage domains. Persons of skill in the art will understand, in view of the description provided herein, how to design a level shift circuit that is capable of providing suitable supply voltage domains.

It should be noted that the illustrative embodiments of the controller device 110 and of the multi-channel optical transceiver module 100 in which it may be used have been described herein for the purposes of demonstrating inventive principles and concepts, but that many modifications may be made to the embodiments described herein that are within the scope of the appended claims, as will be understood by those of skill in the art in view of the description provided herein. For example, while the control device 110 has been described as being employed in an optical transceiver module, it could also be employed in an optical transmitter module that does not have receiver capabilities. Many other variations and modifications may be made to the embodiments described herein, as will be understood by those skilled in the art, and all such modifications and variations are within the scope of the invention.

What is claimed is:

1. A control device for controlling an optical transmitter of an optical transceiver transmitting a first transmission through a medium, and an optical receiver of the optical transceiver receiving a second transmission through a medium, the control device comprising:
    a transmitter interface circuit having a first biasing generator and a second biasing generator, wherein the first and second biasing generators are adapted to control the optical transmitter so as to generate the first transmission, the first and second biasing generators operating in first and second supply voltage domains, respectively, that are substantially non-overlapping;
    a receiver interface circuit configured to at least receive an electrical connection from the receiver;
    a control circuit coupled to the transmitter interface circuit and to the receiver interface circuit, the control circuit being configured to control operations of the first and second biasing generators, wherein the control circuit operates in the first supply voltage domain; and
    a level shift circuit configured to convert a first signal operating within the first supply voltage domain into a first converted signal operating within the second supply voltage domain.

2. The control device of claim 1, wherein the second supply voltage domain ranges from approximately 0 volts (V) to approximately +1.8 V and the first supply voltage domain ranges from approximately −1.5 V to approximately −3.3V.

3. The control device of claim 1, wherein the first and second supply voltage domains are substantially non-overlapping except that a minor voltage overlap may occur in one of a process variation, overshooting, and signal transitioning condition.

4. The control device of claim 1, wherein the first biasing generator is configured to generate at least a first electro-absorption modulator bias voltage for a first electro-absorption modulator.

5. The control device of claim 4, wherein the second biasing generator is configured to generate at least a first laser bias current for a first distributed feedback laser.

6. The control device of claim 5, wherein the transmitter interface circuit further comprises a transmitter monitoring circuit configured to monitor at least a first photocurrent of the first electro-absorption modulator.

7. The control device of claim 1, wherein the first biasing generator and the second biasing generator are configured to generate at least a first electro-absorption modulator bias voltage for a first electro-absorption modulator and at least a first laser bias current for a first distributed feedback laser.

8. The control device of claim 1, wherein the receiver interface circuit comprises a receiver monitoring circuit configured to receive an input signal from the optical receiver that is indicative of a signal strength of the second transmission.

9. The control device of claim 8, wherein the receiver interface circuit further comprises a status communication circuit configured to generate an output signal indicative of loss of signal at the optical receiver.

10. The control device of claim 1, wherein the transmitter interface circuit, the receiver interface circuit, the control circuit and the level shift circuit are integrated in a single integrated circuit chip.

11. The control device of claim 10, wherein the first biasing generator is configured to generate at least first, second, third and fourth electro-absorption modulator bias voltages for first, second, third and fourth electro-absorption modulators, respectively.

12. The control device of claim 11, wherein the second biasing generator is configured to generate at least first, second, third and fourth laser bias currents for at least first, second, third and fourth distributed feedback lasers, respectively.

13. The control device of claim 12, wherein the transmitter interface circuit further comprises a transmitter monitoring circuit for monitoring at least first, second, third and fourth photocurrents of the first, second, third and fourth electro-absorption modulators, respectively.

14. The control device of claim 13, wherein the transmitter interface circuit further comprises a distributed feedback laser bias current monitoring circuit for monitoring at least first, second, third and fourth distributed feedback laser bias currents of the first, second, third and fourth distributed feedback lasers, respectively.

15. The control device of claim 10, wherein the level shift circuit includes:
 a first voltage isolation device having a first N-type metal oxide semiconductor (NMOS) transistor; and
 a second voltage isolation device having a second NMOS transistor, wherein the first NMOS transistor and the second NMOS transistor are in a vertically stacked arrangement.

16. The control device of claim 1, wherein the level shift circuit comprises a first voltage isolation device having at least one terminal operating within the first supply voltage domain.

17. The control device of claim 16, wherein the first voltage isolation device comprises at least a first combination of a first P-substrate isolation device and a first deep n-well device, the first voltage isolation device having a first N-type metal oxide semiconductor (NMOS) transistor having a substrate terminal that is connected to the first P-substrate isolation device, wherein the first deep n-well device is operating in the second supply voltage domain.

18. The control device of claim 17, wherein the level shift circuit further comprises a second voltage isolation device having at least one terminal operating within the second supply voltage domain.

19. The control device of claim 18, wherein the second voltage isolation device comprises at least a second combination of a second P-substrate isolation device and the first deep n-well device, the second voltage isolation device having a second NMOS transistor having a substrate terminal that is connected to the second P-substrate isolation device, and wherein the second deep n-well device is operating in the second supply voltage domain.

20. The control device of claim 1, wherein the control circuit is in two-way communication with a host that operates in the second supply voltage domain, and wherein signals that are sent from the host to the control circuit are converted by the level shift circuit from the second supply voltage domain to the first supply voltage domain before being received by the control circuit.

21. The control device of claim 20, wherein signals that are sent from the control circuit to the host are converted by the level shift circuit from the first supply voltage domain to the second supply voltage domain before being received by the host.

22. The control device of claim 1, wherein the level shift circuit comprises a first level shifter configured to convert an input of the first level shifter that operates within the second supply voltage domain to an output of the first level shifter that operates within the first supply voltage domain, the first level shifter comprising a plurality of P-type metal oxide semiconductor (PMOS) transistors.

23. The control device of claim 22, wherein the level shift circuit comprises a second level shifter configured to convert an input of the second level shifter that operates within the first voltage domain to an output of the second level shifter that operates within the second voltage domain, the second level shifter comprising a differential pair of first and second N-type metal oxide semiconductor (NMOS) transistors and a first voltage isolation device, the first voltage isolation device comprising at least a first combination of a first P-substrate isolation device and the first deep n-well device, the first voltage isolation device having a third NMOS transistor having a substrate terminal that is connected to the first P-substrate isolation device, and wherein the first deep n-well device is operating in the second supply voltage domain.

24. A control device for controlling an optical transmitter of an optical transceiver transmitting a first transmission through a medium, and an optical receiver of the optical transceiver receiving a second transmission through a medium, the control device comprising:
 a transmitter interface circuit having a first biasing generator and a second biasing generator, wherein the first and second biasing generators are adapted to control the optical transmitter so as to generate the first transmission, the first and second biasing generators operating in first and second supply voltage domains, respectively, that are substantially non-overlapping;
 a receiver interface circuit configured to at least receive an electrical connection from the receiver;
 a control circuit coupled to the transmitter interface circuit and to the receiver interface circuit, the control circuit being configured to control operations of the first and second biasing generators, wherein the control circuit operates in the first supply voltage domain; and
 a level shift circuit configured to convert a first signal operating within the first supply voltage domain into a first converted signal operating within the second supply voltage domain, wherein the level shift circuit is configured to convert a second signal operating within the second supply voltage domain to a second converted signal operating within the first supply voltage domain.

25. A method for transmitting and receiving optical signals comprising:
 with control circuit of a control device of an optical transceiver, controlling first and second biasing generators of a transmitter interface circuit of the control device to cause an optical transmitter of the optical transceiver to generate a first transmission, the first and second biasing generators operating in first and second supply voltage domains, respectively, that are substantially non-overlapping, the control circuit operating in the first supply voltage domain;
 with a receiver interface circuit, receiving an electrical connection from a receiver; and with a level shift circuit, converting a first signal operating within the first supply voltage domain into a first converted signal operating within the second supply voltage domain.

26. The method of claim 25 further comprising:
with a transmitter monitoring circuit of the transmitter interface circuit, monitoring a photocurrent of the optical transmitter, wherein the photocurrent is within the first supply voltage domain;
storing an indication of the monitored photocurrent in a control register of the control circuit; and
converting a signal representing the stored indication from the first supply voltage domain to the second supply voltage domain for transmission to an external host.

27. The method of claim 26, wherein the optical transmitter includes at least a first externally modulated laser comprising a first electro-absorption modulator and a first distributed feedback laser, the first transmission including a first electro-absorption modulator bias voltage and a first distributed feedback laser bias current, and wherein the photocurrent is a photocurrent of the first electro-absorption modulator.

28. The method of claim 27, further comprising:
with a distributed feedback laser bias current monitoring circuit of the transmitter interface circuit, monitoring a bias current of the first distributed feedback laser, the distributed feedback laser bias current monitoring circuit operating in the second supply voltage domain;
converting a signal representing the indication of the monitored bias current from the second supply voltage domain to the first supply voltage domain for transmission to the external host;
storing the indication of the monitored bias current in a control register of the control circuit; and
converting a signal representing the stored indication of the monitored bias current from the first supply voltage domain to the second supply voltage domain for transmission to the external host.

29. The method of claim 28, further comprising:
transmitting a signal representing a new distributed feedback bias current in the second supply voltage domain from the external host to the control device;
converting the signal representing the new distributed feedback bias current from the second supply voltage domain to the first supply voltage domain;
storing an indication of the new distributed feedback bias current in a control register of the control circuit; and
converting a signal representing the stored indication of the new distributed feedback bias current from the first supply voltage domain to the second supply voltage domain for transmission to the first distributed feedback laser.

30. The method of claim 28, further comprising:
transmitting a signal representing a new electro-absorption modulator bias voltage in the second supply voltage domain from the external host to the control device;
converting the signal representing the new electro-absorption modulator bias voltage from the second supply voltage domain to the first supply voltage domain;
storing an indication of the new electro-absorption modulator bias voltage in a control register of the control circuit; and
converting a signal representing the stored indication of the new electro-absorption modulator bias voltage from the first supply voltage domain to the second supply voltage domain for transmission to the first electro-absorption modulator.

* * * * *